(12) United States Patent
Lee et al.

(10) Patent No.: US 9,390,214 B2
(45) Date of Patent: Jul. 12, 2016

(54) METHODS OF PREPARING LAYOUTS FOR SEMICONDUCTOR DEVICES, PHOTOMASKS FORMED USING THE LAYOUTS, AND SEMICONDUCTOR DEVICES FABRICATED USING THE PHOTOMASKS

(71) Applicant: Samsung Electronics Co., Ltd., Suwon-si (KR)

(72) Inventors: HunKook Lee, Hwaseong-si (KR); Hongsoo Kim, Seongnam-si (KR); Juyeon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/576,695

(22) Filed: Dec. 19, 2014

(65) Prior Publication Data
US 2015/0261905 A1    Sep. 17, 2015

(30) Foreign Application Priority Data

Mar. 11, 2014  (KR) .......................... 10-2014-0028462

(51) Int. Cl.
| | | |
|---|---|---|
| H01L 21/70 | (2006.01) |
| G06F 17/50 | (2006.01) |
| G03F 1/00 | (2012.01) |
| H01L 27/088 | (2006.01) |
| H01L 29/06 | (2006.01) |
| H01L 21/8234 | (2006.01) |
| H01L 27/02 | (2006.01) |

(52) U.S. Cl.
CPC .............. *G06F 17/5072* (2013.01); *G03F 1/00* (2013.01); *G06F 17/5081* (2013.01); *H01L 21/823437* (2013.01); *H01L 21/823456* (2013.01); *H01L 27/0207* (2013.01); *H01L 27/088* (2013.01); *H01L 29/0653* (2013.01)

(58) Field of Classification Search
CPC ................. G06F 17/5072; G03F 1/00; H01L 21/823437; H01L 21/823456; H01L 29/0653
See application file for complete search history.

(56) References Cited

U.S. PATENT DOCUMENTS

| | | | |
|---|---|---|---|
| 6,287,904 B1 | 9/2001 | Lee et al. | |
| 6,359,305 B1 | 3/2002 | Chiu | |
| 6,453,457 B1 | 9/2002 | Pierrat et al. | |
| 6,691,297 B1* | 2/2004 | Misaka | ............... G06F 17/5068 430/30 |
| 6,859,918 B2 | 2/2005 | Ma et al. | |
| 6,867,100 B2 | 3/2005 | Edwards et al. | |
| 7,105,901 B1 | 9/2006 | Miyanishi et al. | |

(Continued)

FOREIGN PATENT DOCUMENTS

| | | |
|---|---|---|
| JP | 07-066397 | 3/1995 |
| JP | 2007059565 | 3/2007 |
| KR | 20110081833 | 7/2011 |

*Primary Examiner* — Shaun Campbell
(74) *Attorney, Agent, or Firm* — Myers Bigel & Sibley, P.A.

(57) ABSTRACT

Methods of preparing layouts for semiconductor devices and semiconductor devices fabricated using the layouts are provided. Preparing the layouts for semiconductor devices may include disposing assistant patterns near a main gate pattern that is provided on a weak active pattern. The weak active pattern may be, for example, an outermost one of active patterns and may be one expected to have an increased width during a fabrication process.

8 Claims, 18 Drawing Sheets

(56) References Cited

U.S. PATENT DOCUMENTS

| | | |
|---|---|---|
| 7,644,388 B1 | 1/2010 | Daldoss et al. |
| 7,795,046 B2 | 9/2010 | Dakshina-Murthy et al. |
| 8,105,929 B2 | 1/2012 | Chuang et al. |
| 8,273,617 B2 | 9/2012 | Thompson et al. |
| 8,426,745 B2 | 4/2013 | Gaul et al. |
| 2006/0237783 A1* | 10/2006 | Eun ................ H01L 21/823412 257/330 |
| 2008/0250383 A1* | 10/2008 | Tanaka .................... G03F 1/144 716/55 |
| 2010/0078823 A1 | 4/2010 | Beyer et al. |

* cited by examiner

FIG. 6A
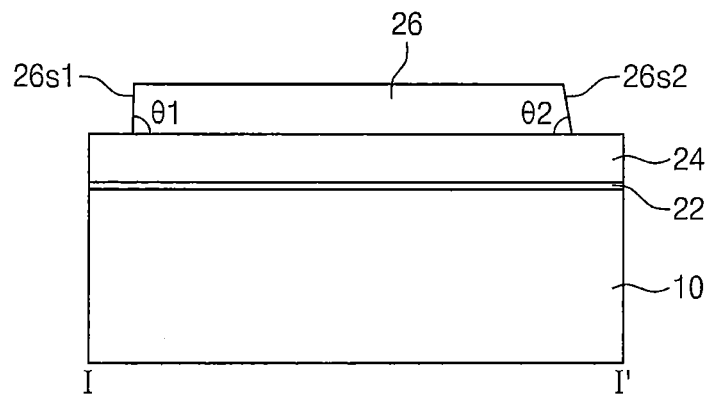
FIG. 6B
FIG. 6C
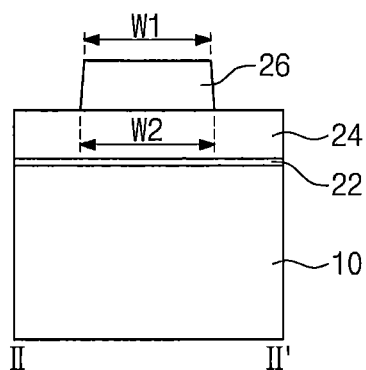
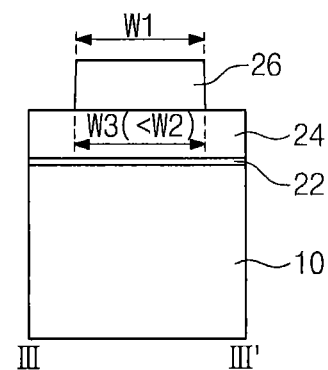

METHODS OF PREPARING LAYOUTS FOR SEMICONDUCTOR DEVICES, PHOTOMASKS FORMED USING THE LAYOUTS, AND SEMICONDUCTOR DEVICES FABRICATED USING THE PHOTOMASKS

CROSS-REFERENCE TO RELATED APPLICATION

This U.S. non-provisional patent application claims priority under 35 U.S.C. §119 to Korean Patent Application No. 10-2014-0028462, filed on Mar. 11, 2014, in the Korean Intellectual Property Office, the disclosure of which is hereby incorporated by reference herein in its entirety.

BACKGROUND

Example embodiments of the inventive concept relate to a method of preparing a layout for a semiconductor device, a photomask formed using the layout, and a semiconductor device fabricated using the photomask.

In the design and fabrication of a semiconductor device, there has been an increasing demand for a high density peripheral circuit. Accordingly, research has been conducted to reduce a space between active regions of transistors in the peripheral circuit. Meanwhile, it is hard to remove a spatial variation in fabrication process. For example, there may be a position-dependent variation in an etching process for forming active regions and gate electrodes of the transistors. Accordingly, for the active region or the gate electrode, there may be a difference between an initially-designed layout and an actually-fabricated shape. This may lead to a failure (e.g., leakage current) of a semiconductor device.

SUMMARY

Example embodiments of the inventive concept provide a method of preparing a layout, which allows for realizing a highly reliable semiconductor device.

Some example embodiments of the inventive concept provide a semiconductor device with an improved leakage current property.

Example embodiments of the inventive concept provide a photomask allowing for realizing a highly reliable semiconductor device.

According to example embodiments of the inventive concept, a method of preparing a layout of a semiconductor device may include disposing active patterns adjacent each other, disposing main gate patterns on the active patterns, respectively and disposing at least one assistant pattern beside the main gate patterns disposed on an outermost one of the active patterns.

In example embodiments, disposing the active patterns may include disposing first and second active patterns that are parallel to each other and may extend in a first direction. The second active pattern may include a portion protruding from the first active pattern toward the first direction. An outermost one of the main gate patterns may cross the second active pattern. The at least one assistant pattern may include at least one first assistant pattern that is in contact with the outermost one of the main gate patterns. The first assistant pattern may be disposed beside a side of the outermost one of the main gate patterns that is not adjacent the first active pattern and is disposed spaced apart from the first active pattern by at least a distance between the first and second active patterns.

In example embodiments, the outermost one of the main gate patterns and the first assistant pattern may have sides positioned on an offset line that is equidistant from the first active pattern.

In example embodiments, the method may further include disposing a third active pattern spaced apart from the first active pattern with the second active pattern interposed therebetween. The second active pattern may include the portion protruding from the first and third active pattern toward the first direction. The method may additionally include disposing a second assistant pattern to be in contact with the outermost one of the main gate patterns. The outermost one of the main gate patterns and the second assistant pattern may have sides positioned on an offset line that is equidistant from the third active pattern.

According to example embodiments of the inventive concept, a semiconductor device may include a substrate, a device isolation layer provided in the substrate to define first to third active regions adjacent each other, the second active region laterally protruding from an outermost edges of the first and third active regions, and a gate electrode crossing the second active region. The gate electrode may include first and second sidewalls crossing the second active region and facing each other. The second active region may be disposed between the first and third active regions and may include first and second ends that are opposite to each other and are disposed adjacent the first and second sidewalls, respectively. Further, the first and second sidewalls may have different widths, and the first and second ends may have different widths.

In example embodiments, widths of the first and second sidewalls overlapped with the device isolation layer may be about 30 nm or greater than 30 nm.

In example embodiments, the second end may be laterally spaced apart from the outermost edges of the first and third active regions, and the width of the second end may be greater than that of the first end.

In example embodiments, the width of the second sidewall may be greater than that of the first sidewall.

In example embodiments, a sidewall of the device isolation layer adjacent the first end forms a first angle with respect to a top surface of the substrate, and another sidewall of the device isolation layer adjacent the second end forms a second angle with respect to the top surface of the substrate. The first and second angles may be different.

In example embodiments, the first angle may be smaller than the second angle.

In example embodiments, the gate electrode may have an asymmetric shape, in a plan view.

According to example embodiments of the inventive concept, a photomask may include a transparent substrate and a light-blocking pattern defining gate electrodes provide on the transparent substrate. The light-blocking pattern may include gate openings corresponding to the gate electrodes, respectively, or gate light-blocking patterns corresponding to the gate electrodes, respectively. An outermost one of the gate openings or an outermost one of the gate light-blocking patterns may have a shape different from the others.

In example embodiments, the outermost one of the gate openings or the outermost one of the gate light-blocking patterns may have an asymmetric shape, in a plan view.

In example embodiments, the outermost one of the gate openings may have a first side, which is located adjacent the others of the gate openings, and a second side, which is located in a direction away from the others of the gate openings. The first and second sides may face each other, and the second side may be longer than the first side.

In example embodiments, the outermost one of the gate light-blocking patterns may have a first side, which is located adjacent the others of the gate light-blocking patterns, and a second side, which is located in a direction away from the others of the gate light-blocking patterns. The first and second sides may face each other, and the second side may be longer than the first side.

According to example embodiments of the inventive concept, a method of fabricating a semiconductor device may include forming active regions on a substrate, forming a conductive layer on the active regions, forming photoresist patterns defining gate electrodes on the conductive layer, and forming the gate electrodes by using the photoresist patterns as an etch mask. An outermost one of the photoresist patterns may have a shape different from the others.

In example embodiments, the outermost one of the photoresist patterns may include first and second sidewalls crossing an outermost one of the active regions and facing each other. The first and second sidewalls may have different widths.

In example embodiments, forming the active regions may include forming mask patterns defining the active regions on the substrate, etching the substrate by using the mask patterns as an etch mask, and forming a trench simultaneously, and forming a device isolation layer to fill the trench. An outermost one of the mask patterns may have a third sidewall, which is located adjacent the others of the mask patterns, and a fourth sidewall, which is located in a direction away from the others of the mask patterns. The fourth sidewall may be longer than the third sidewall.

In example embodiments, an outermost one of the gate electrodes may include fifth and sixth sidewalls crossing an outermost one of the active regions and facing each other. The fifth and sixth sidewalls vertically overlapped with the device isolation layer may have a width about 30 nm or greater than 30 nm.

In example embodiments, the third sidewall may form a first angle with respect to a bottom surface of the outermost one of the mask patterns, and the fourth sidewall may form a second angle with respect to the bottom surface of the outermost one of the mask patterns. The first and second angles may be different.

BRIEF DESCRIPTION OF THE DRAWINGS"

Example embodiments will be discussed with the accompanying drawings. The accompanying drawings represent non-limiting, example embodiments as described herein.

FIGS. 6A, 7A, 8A, 9A and 10A are sectional views taken along the line I-I' of FIG. 5 to illustrate a process of fabricating a semiconductor device, according to example embodiments of the inventive concept.

FIGS. 6B, 7B, 8B, 9B and 10B are sectional views taken along the line II-II' of FIG. 5 to illustrate a process of fabricating a semiconductor device, according to example embodiments of the inventive concept.

FIGS. 6C, 7C, 8C, 9C and 10C are sectional views taken along the line III-III' of FIG. 5 to illustrate a process of fabricating a semiconductor device, according to example embodiments of the inventive concept.

Figure 1:
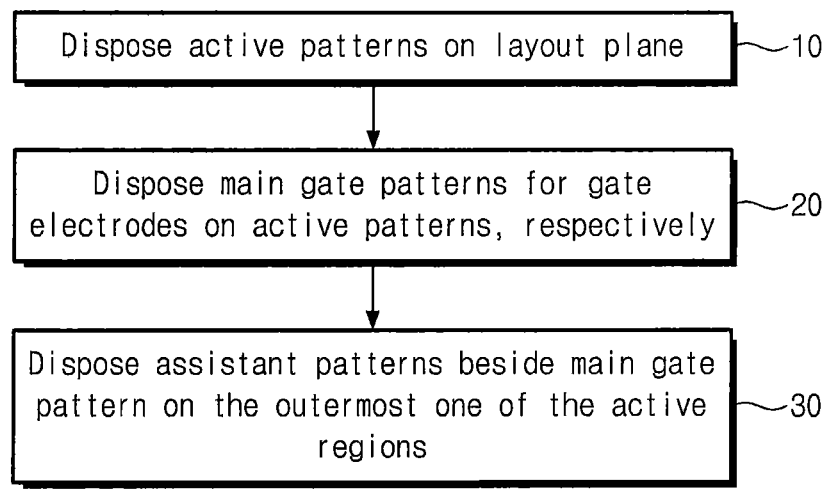
FIG. 1 is a flow chart illustrating a method of preparing a layout for a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
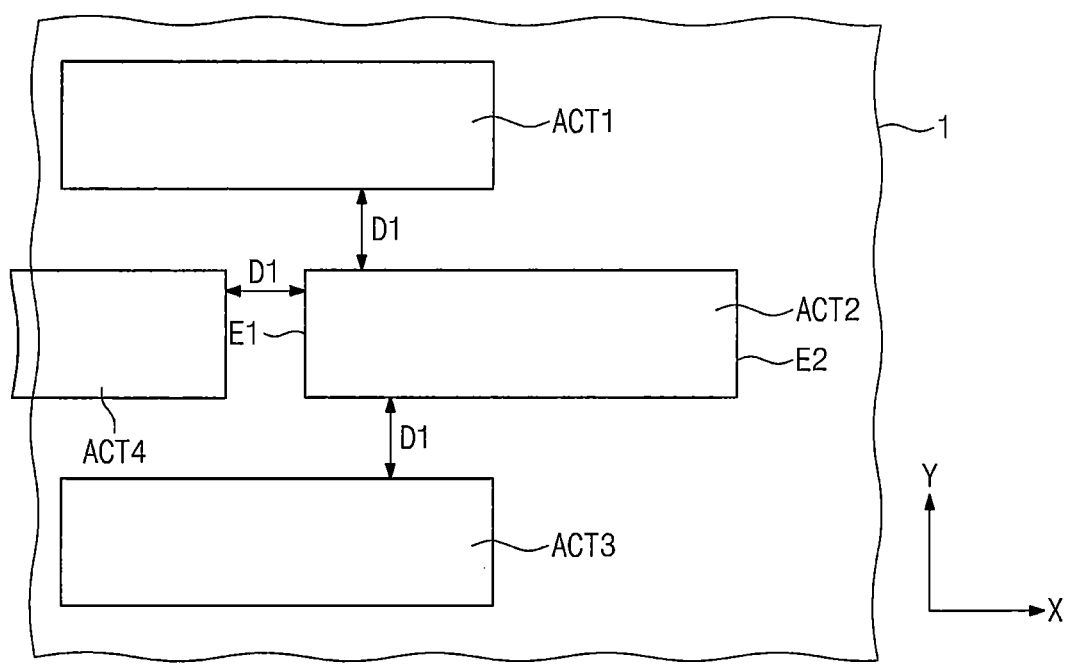
FIGS. 2 through 4 are plan views illustrating a method of preparing a layout for a semiconductor device according to example embodiments of the inventive concept.
Figure 3:
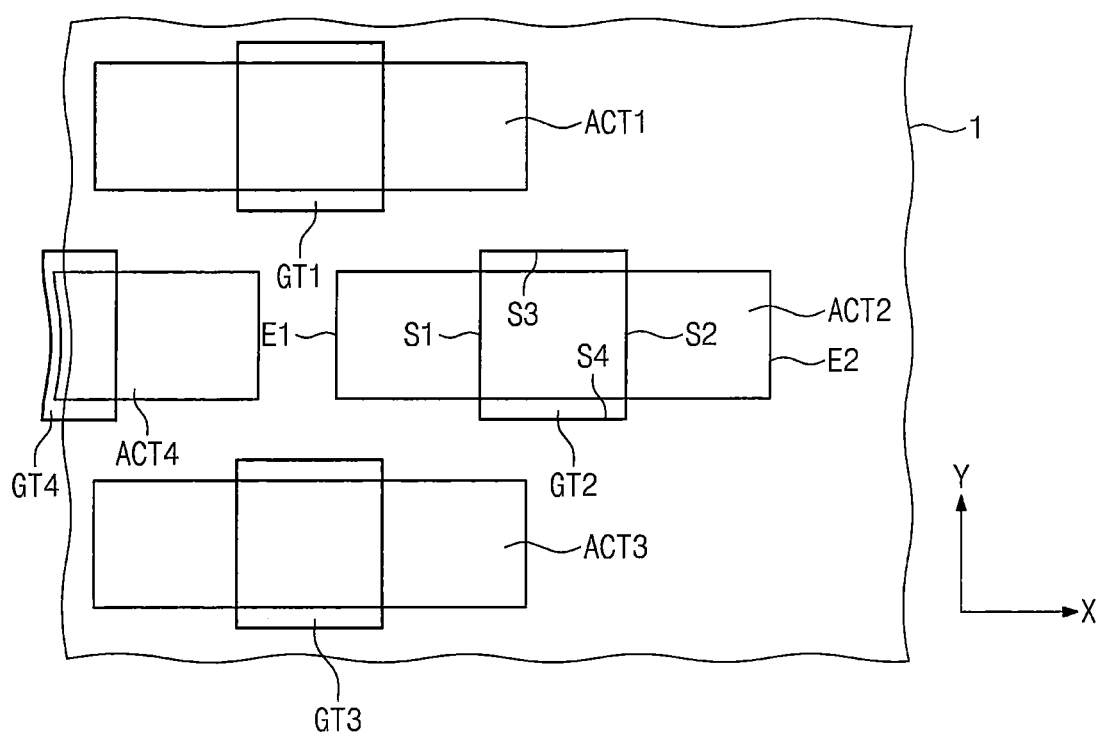
Figure 4:
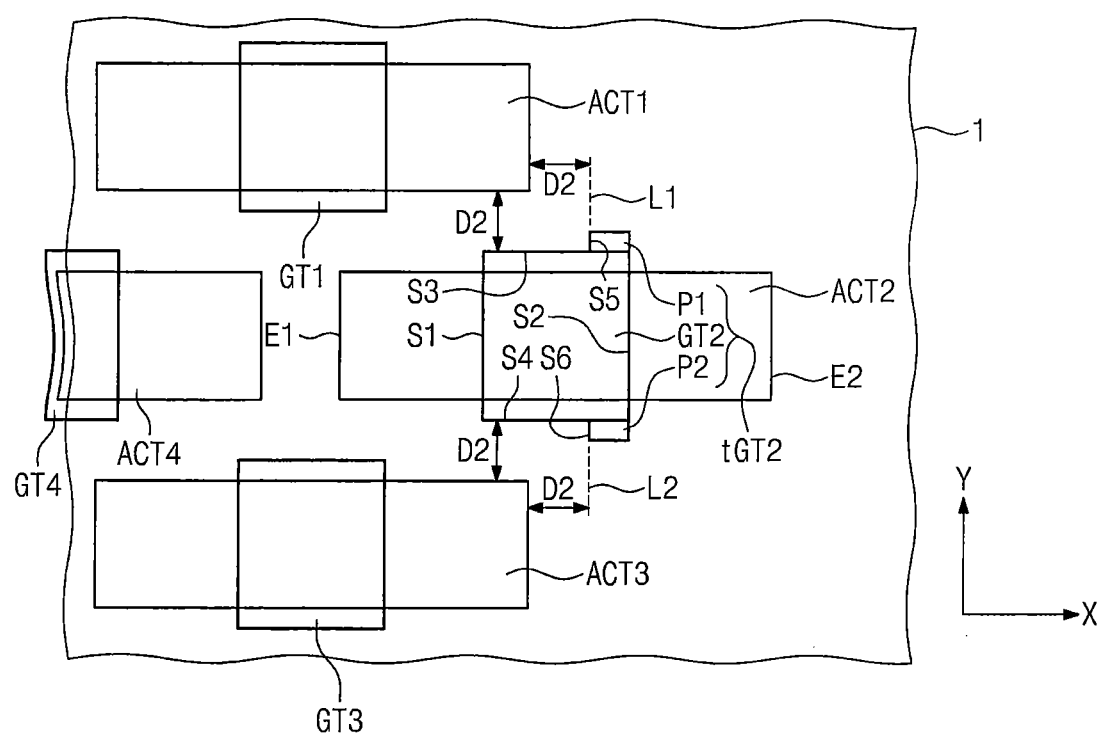

FIG. 1 is a flow chart illustrating a method of preparing a layout for a semiconductor device according to example embodiments of the inventive concept. FIGS. 2 through 4 are plan views illustrating a method of preparing a layout for a semiconductor device according to example embodiments of the inventive concept.

Referring to FIGS. 1 and 2, active patterns ACT1 through ACT4 may be disposed on a layout plane 1 (Block 10). For example, the active patterns ACT1 through ACT4 may include transistors of a peripheral circuit. In example embodiments, the active patterns ACT1 through ACT4 may include a first active pattern ACT1, a second active pattern ACT2, a third active pattern ACT3, and a fourth active pattern ACT4. Each of the first through fourth active patterns ACT1 through ACT4 may be a bar-shaped structure extending in a first direction X. The first to fourth active patterns ACT1 through ACT4 may be parallel to each other. In some example embodiments, the second active pattern ACT2 and the fourth active pattern ACT4 may be disposed in such a way that longitudinal axes thereof are on the same straight line. The first to fourth active patterns ACT1 through ACT4 may be disposed spaced apart from each other by a first distance D1. At least one of the active patterns (for example, the second active pattern ACT2) may have a portion protruding from the others (for example, the first and third active patterns ACT1 and ACT3) in the first direction X. The second active pattern ACT2 may include a first end E1 adjacent the fourth active pattern ACT4 and a second end E2 opposite the first end E1.

Referring to FIGS. 1 and 3, main gate patterns GT1 through GT4 may be disposed on the respective active patterns ACT1 through ACT4 (Block 20) to define gate electrodes of the transistors. Each of the main gate patterns GT1 through GT4 may be disposed on a central region of the corresponding active patterns ACT1 through ACT4. In example embodiments, the main gate patterns GT1 through GT4 may include a first main gate pattern GT1, a second main gate pattern GT2, a third main gate pattern GT3 and a fourth main gate pattern GT4. The second main gate pattern GT2 may be disposed on the outermost one (for example, the second active pattern ACT2) of the active patterns ACT1 through ACT4 in the first direction and may include a first side S1 adjacent the first end E1, a second side S2 opposite the first side S1, a third side S3 adjacent the first active pattern ACT1 and between the first side S1 and the second side S2, and a fourth side S4 adjacent the third active pattern ACT3 and between the first side S1 and the second side S2.

Referring to FIGS. 1 and 4, assistant patterns P1 and P2 may be disposed on sides of the second main gate pattern GT2, which is disposed on the outermost one of the active patterns, for example, the second active pattern ACT2 (Block S30). The assistant patterns P1 and P2 may be disposed on portions of the third and fourth sides S3 and S4, respectively, which are adjacent the second side S2. In example embodiments, the assistant patterns P1 and P2 may include a first assistant pattern P1 and a second assistant pattern P2. The first assistant pattern P1 may have a fifth side S5 that is adjacent one of corners of the first active pattern ACT1. The second assistant pattern P2 may have a sixth side S6 that is adjacent one of corners of the third active pattern ACT3. The first active pattern ACT1 may be spaced apart from the second main gate pattern GT2 by a second distance D2, and the third active pattern ACT3 may also be spaced apart from the second main gate pattern GT2 by the second distance D2. Both of the fifth side S5 of the first assistant pattern P1 and the third side S3 of the second main gate pattern GT2 may be positioned on a first offset line L1, which is spaced apart from the first active pattern ACT1 by the second distance D2. Similarly, both of the sixth side S6 of the second assistant pattern P2 and the fourth side S4 of the second main gate pattern GT2 may be positioned on a second offset line L2, which is spaced apart from the third active pattern ACT3 by the second distance D2. The second main gate pattern GT2 and the assistant patterns P1 and P2 may constitute a layout for a second gate electrode, which will be referred to as a "second gate layout tGT2".

As described above, the assistant patterns P1 and P2 may be disposed adjacent the second side S2, and this is because the second end E2 of the second active pattern ACT2 protrudes outward compared with outer edges of other active patterns (for example, ACT1, ACT3, and ACT4). In other words, there is no active pattern near the second end E2 of the second active pattern ACT2. Since there is no active pattern near the second end E2 of the second active pattern ACT2, a process of fabricating a semiconductor device may suffer from a difference in process condition between a region near the second end E2 and the other region. For example, a resulting pattern actually formed on a wafer may have a shape that is different from a shape of the layout. As an example, the resulting pattern of the second active pattern ACT2 near the second end E2 may have an increased width compared with a shape defined in the layout. Stated in other words, when the fabrication process is performed using a layout in which the assistant patterns P1 and P2 are not included, for example, a layout illustrated in FIG. 3, and include only the main gate patterns GT1 through GT4, the second gate electrode may be formed to insufficiently cover the second active pattern ACT2, and this may lead to a leakage current during device operation. In example embodiments, assistant patterns may be disposed near a weak point of the active pattern that is expected to have a wider pattern after the actual fabrication process is performed, and this may make it possible to reduce or possibly prevent the resulting gate electrode from having a smaller width than a desired width. Further, this may make it possible to reduce or possibly suppress the occurrence of leakage current and thereby to realize a semiconductor device with improved reliability.

A method of preparing a layout for a semiconductor device according to example embodiments was described above. Hereinafter, a method of fabricating a semiconductor device using the layout will be described.

Figure 5:
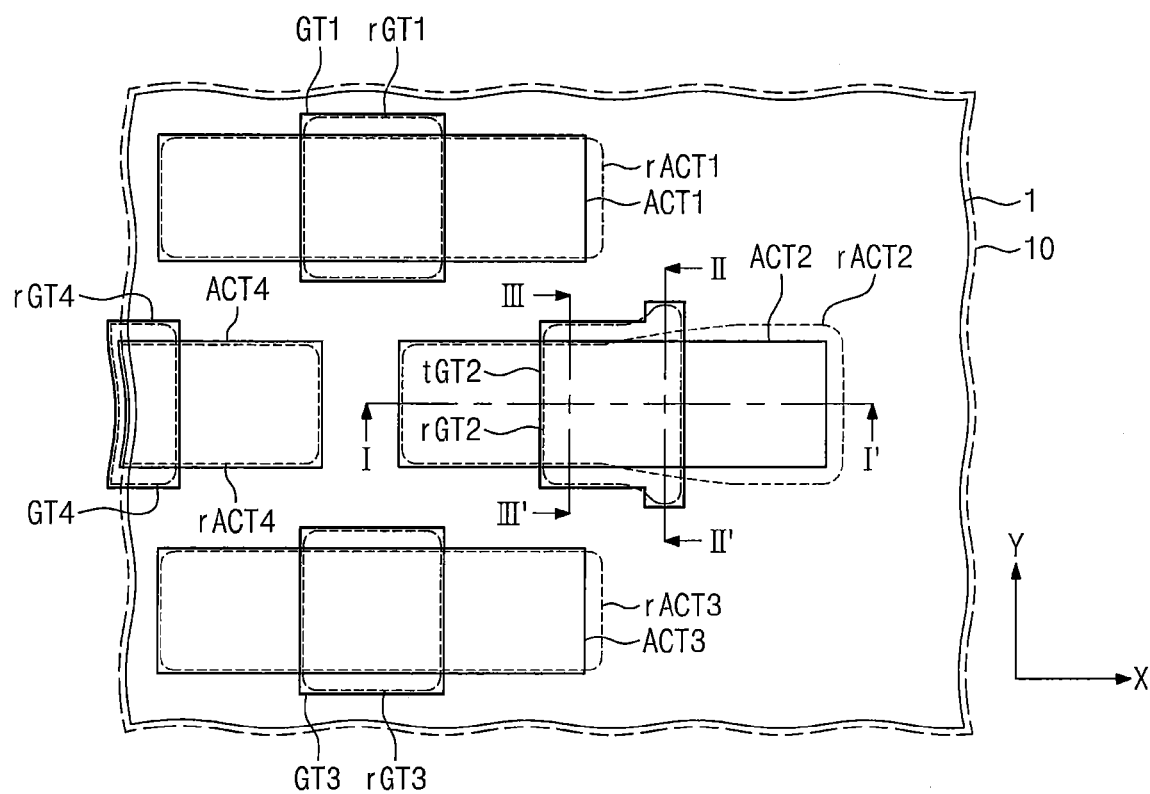
FIG. 5 is a plan view illustrating a planar shape of a resulting pattern that is overlapped on the layout of FIG. 4.
Figure 12A:
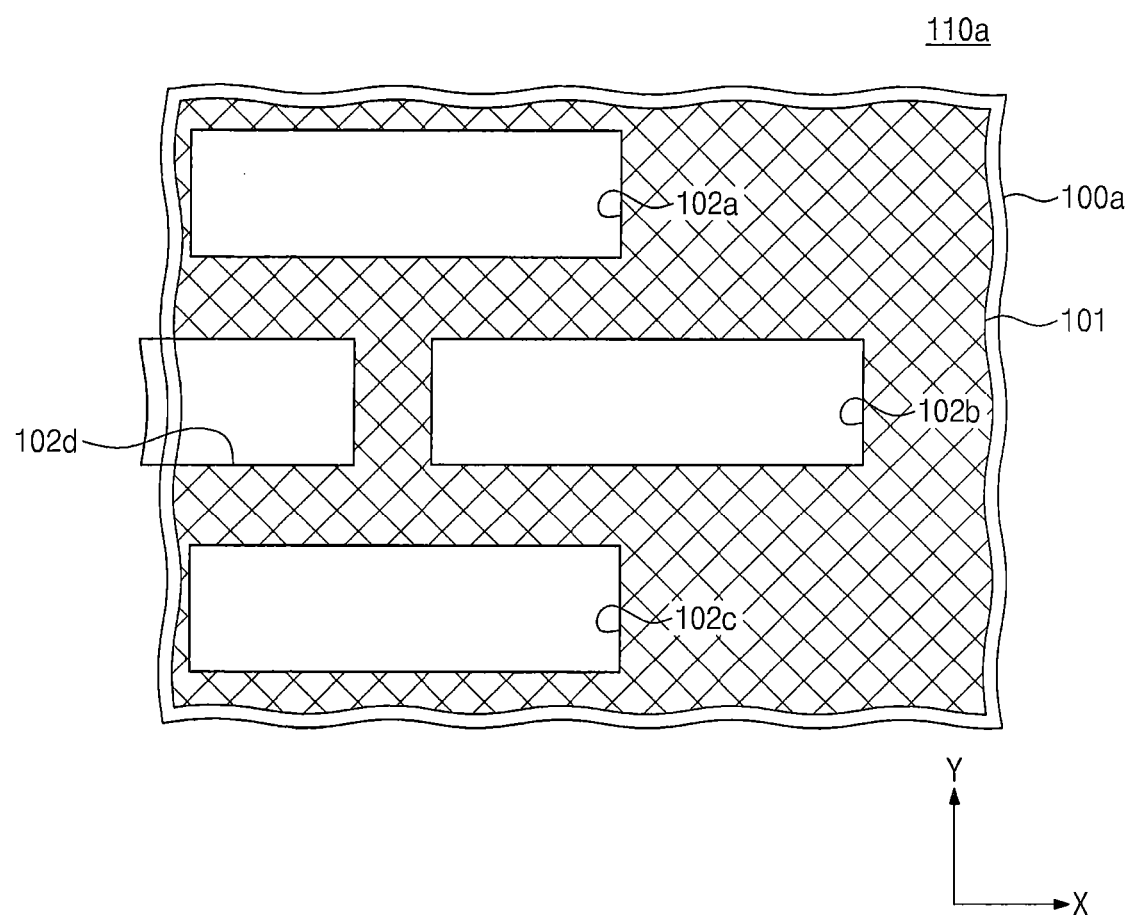
FIGS. 12A and 12B are plan views of photomasks for defining active regions, according to example embodiments of the inventive concept.
Figure 12B:
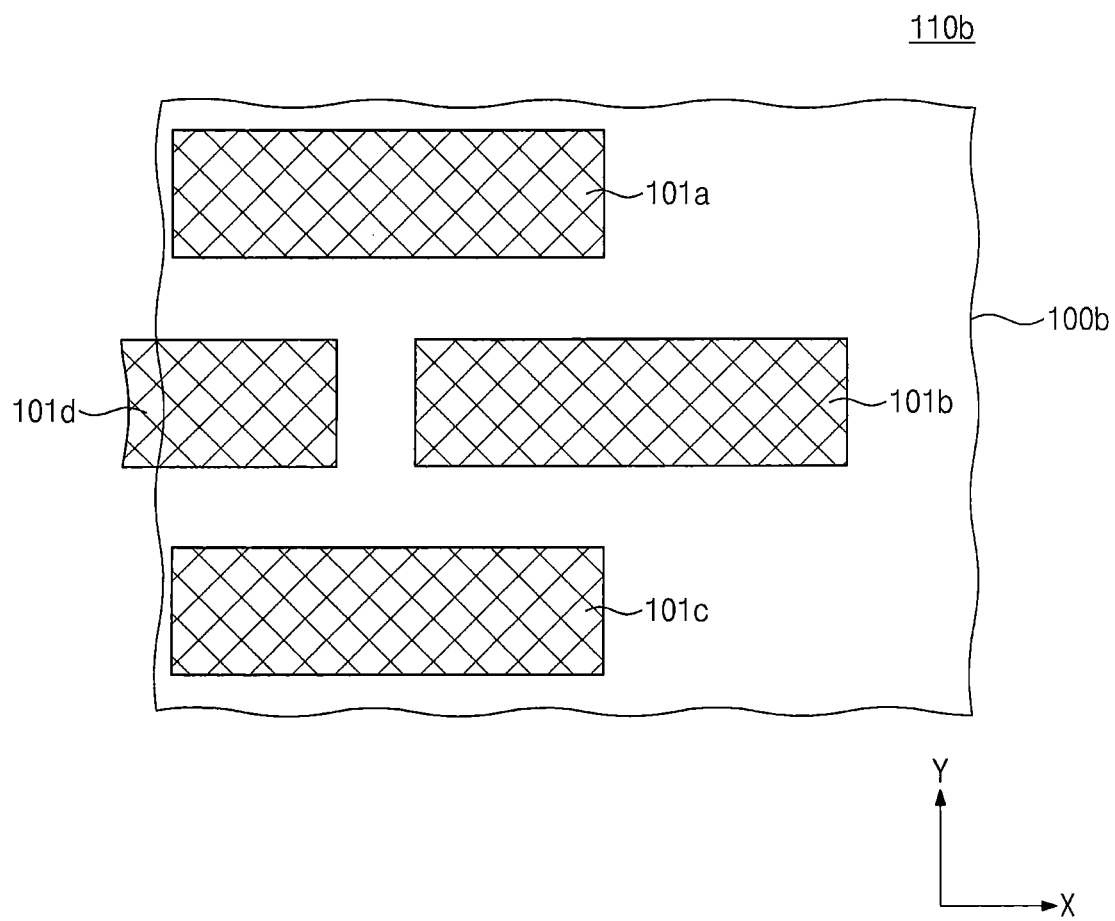
Figure 13A:
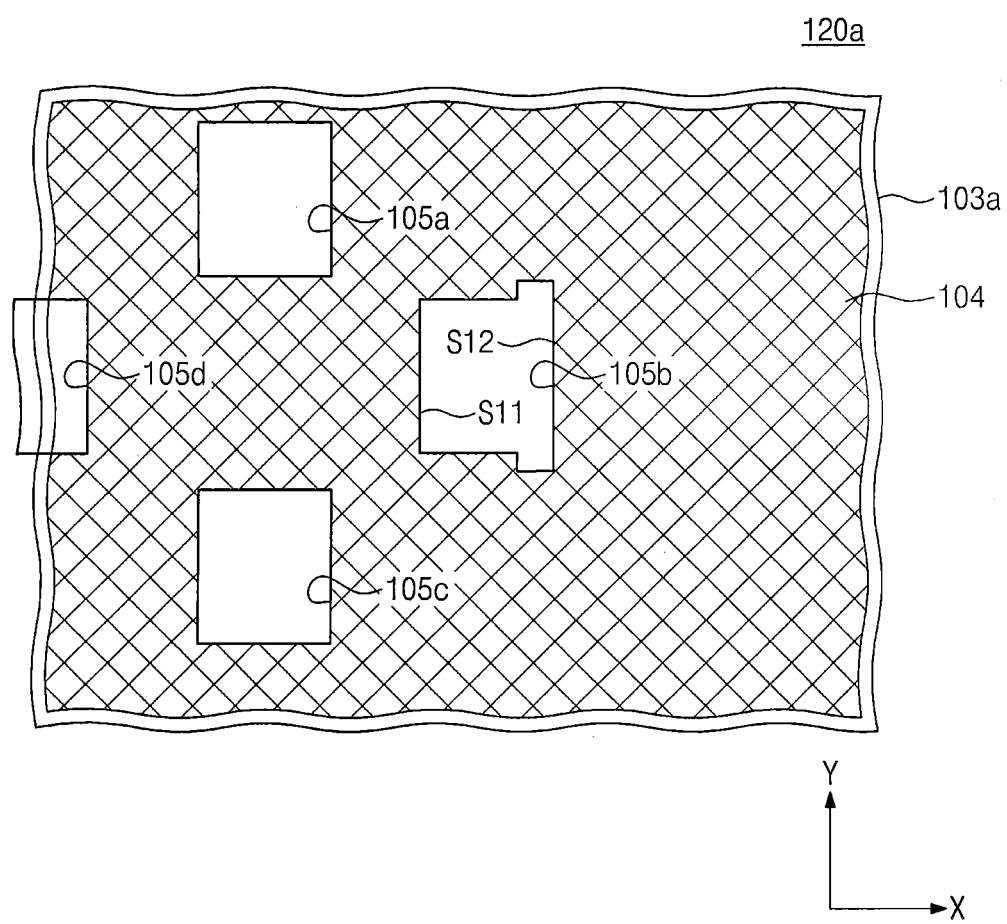
FIGS. 13A and 13B are plan views of photomasks for defining gate electrodes, according to example embodiments of the inventive concept.
Figure 13B:
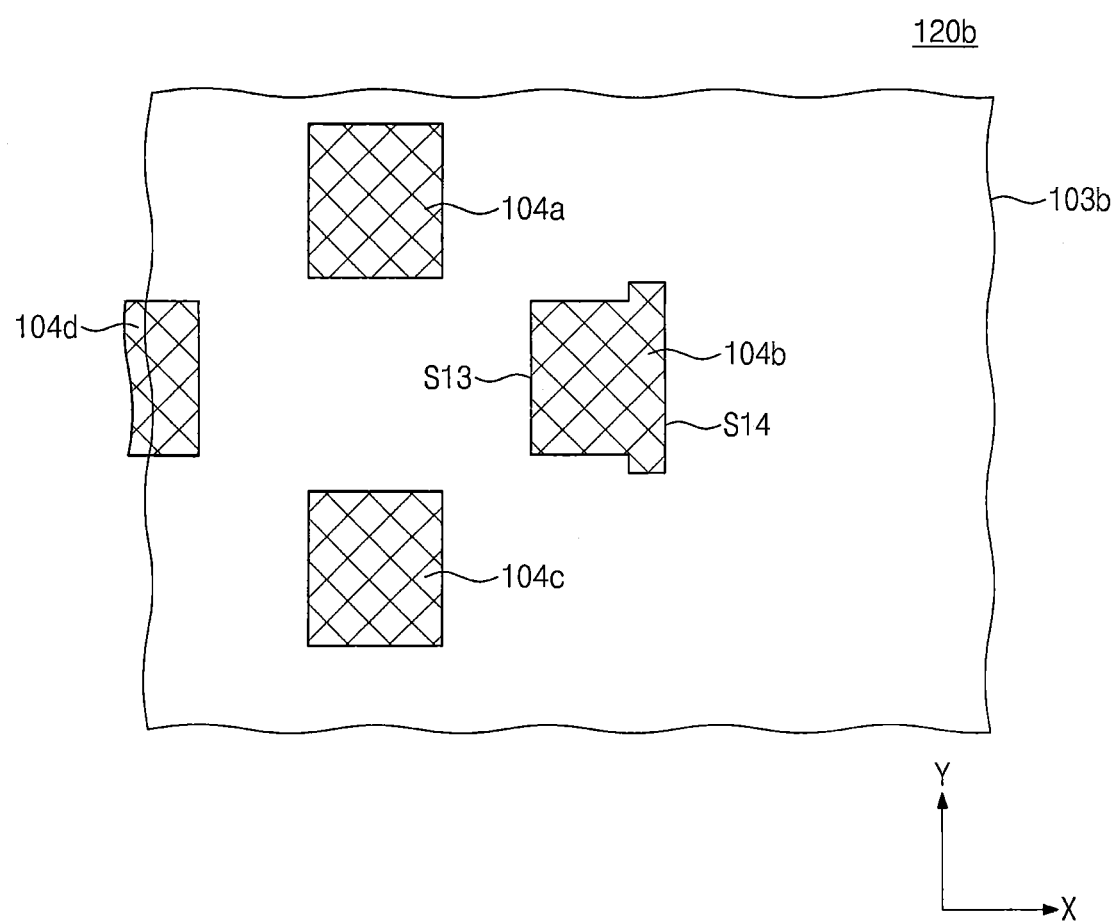

FIG. 5 is a plan view illustrating a resulting pattern that is overlapped on the layout of FIG. 4. FIGS. 6A, 7A, 8A, 9A and 10A are cross-sectional views taken along the line I-I' of FIG. 5 illustrating a process of fabricating a semiconductor device according to example embodiments of the inventive concept. FIGS. 6B, 7B, 8B, 9B and 10B are cross-sectional views taken along the line II-II' of FIG. 5 illustrating a process of fabricating a semiconductor device according to example embodiments of the inventive concept. FIGS. 6C, 7C, 8C, 9C and 10C are cross-sectional views taken along the line III-III' of FIG. 5 illustrating a process of fabricating a semiconductor device according to example embodiments of the inventive concept. FIGS. 12A and 12B are plan views of photomasks for defining active regions according to example embodiments of the inventive concept, and FIGS. 13A and 13B are plan views of photomasks for defining gate electrodes, according to example embodiments of the inventive concept.

Referring to FIGS. 5 and 6A through 6C, a buffer layer 22 and a mask layer 24 may be sequentially formed on a top surface of a substrate 10. In some example embodiments, the buffer layer 22 and the mask layer 24 may cover an entire top surface of the substrate 10. The buffer layer 22 may be, for example, a silicon oxide layer. The mask layer 24 may have an etch selectivity with respect to the substrate 10. For example, the mask layer 24 may include at least one of a silicon oxide layer, a silicon nitride layer, a silicon oxynitride layer, a poly-silicon layer, a hydrocarbon layer, and so forth. A photoresist pattern 26 may be formed on the mask layer 24. The photoresist pattern 26 for defining a shape of the second active pattern ACT2 is illustrated in FIGS. 6A through 6C as an example. Although their sectional views are not illustrated, other photoresist patterns for defining other active patterns ACT1, ACT3, and ACT4 may be formed concurrently with the photoresist pattern 26.

Referring to FIGS. 12A and 12B, the formation of the photoresist pattern 26 may include coating a first photoresist layer on the mask layer 24 and performing exposure and developing processes thereon. The exposure process may be performed using one of a first photomask 110a of FIG. 12A and a second photomask 110b of FIG. 12B, which are prepared based on the layout of FIG. 2. For example, if the first photoresist layer is of a negative type, an exposed portion thereof may remain and an unexposed portion thereof may be removed, after the developing process. In this case, the exposure process may be performed using the first photomask 110a of FIG. 12A. For example, the first photomask 110a may include a first transparent substrate 100a and a first light-blocking pattern 101 disposed on the first transparent substrate 100a. The first light-blocking pattern 101 may be formed to include active region openings 102a through 102d having shapes similar to shapes of the active patterns ACT1-ACT4, respectively. As another example, if the first photoresist layer is of a positive type, an exposed portion thereof may be removed and an unexposed portion thereof may remain, after the developing process. In this case, the exposure process may be performed using the second photomask 110b of FIG. 12B. For example, the second photomask 110b may include a second transparent substrate 100b and second light-blocking patterns 101a through 101d disposed on the second transparent substrate 100b. The second light-blocking patterns 101a through 101d may be formed to have shapes similar to shapes of the active patterns ACT1-ACT4.

Referring back to FIGS. 5 and 6A through 6C, due to a spatial variation in optical characteristics of the exposure process (for example, interference), the photoresist pattern 26 may be formed to have a spatial variation in sidewall angle (for example, between wide and narrow spacing regions). For example, the photoresist pattern 26 may include a first sidewall 26s1, which is located adjacent another photoresist pattern for defining the fourth active pattern ACT4, and a second sidewall 26s2 opposite the first sidewall 26s1. For example, the first sidewall 26s1 and second sidewall 26s2 may be inclined at first and second angles θ1 and θ2 with respect to a bottom surface of the photoresist pattern 26. In example embodiments, the first sidewall 26s1 may be steep or be inclined at the first angle θ1 of about 90 degrees, and the second sidewall 26s2 may be gently inclined at the second angle θ2 that is smaller than the first angle θ1. Accordingly, as shown in FIGS. 6B and 6C, a top surface of the photoresist pattern 26 may have a first width W1 that is uniform, and a bottom surface of the photoresist pattern 26 may have a width varying according to a position (for example, ranging from a second width W2 to a third width W3). For example, as shown in FIG. 6B, at a position spaced far apart from neighboring active patterns ACT1, ACT3, and ACT4, the bottom surface of the photoresist pattern 26 may have the second width W2. In contrast, as shown in FIG. 6C, at another position adjacent the neighboring active patterns ACT1, ACT3, and ACT4, the bottom surface of the photoresist pattern 26 may have the third width W3 that is smaller than the second width W2.

Figure 7A:
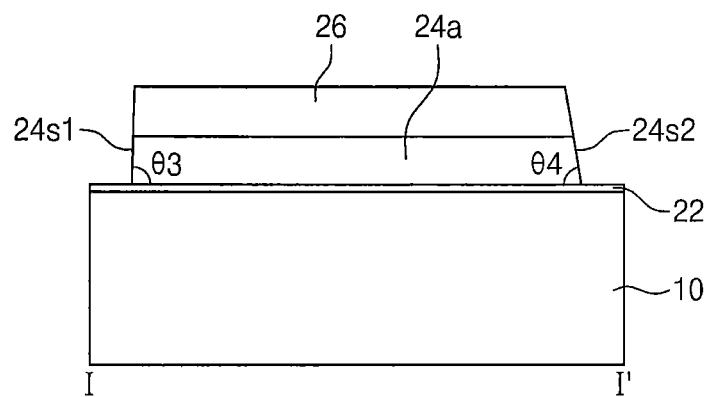
Figure 7B:
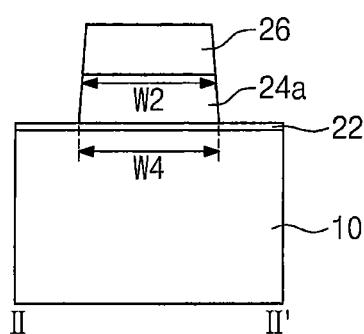
Figure 7C:
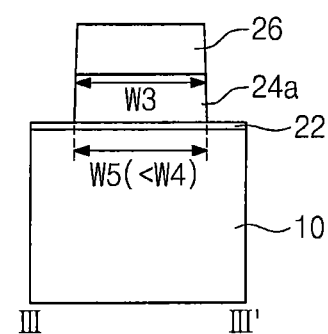

Referring to FIGS. 5 and 7A through 7C, the mask layer 24 may be etched using the photoresist pattern 26 as an etch mask to form a mask pattern 24a. The mask pattern 24a for defining the shape of the second active pattern ACT2 is illustrated in FIGS. 7A through 7C as an example. Although their sectional views are not illustrated, other mask patterns for defining other active patterns ACT1, ACT3, and ACT4 may be formed concurrently with the mask pattern 24a through the etching process. In the etching process, there may be a difference in etching environment or condition between wide and narrow spacing regions. For example, an etch-loading effect may occur in the wide spacing region. Accordingly, the mask pattern 24a formed by the etching process may have a sidewall slope varying according to a position. In detail, the mask pattern 24a may include a first sidewall 24s1, which is adjacent another mask pattern for defining the fourth active pattern ACT4, and a second sidewall 24s2 opposite the first sidewall 24s1. For example, the first and second sidewalls 24s1 and 24s2 of the mask pattern 24a may be inclined at third and fourth angles θ3 and θ4 with respect to a bottom surface of the mask pattern 24a. In example embodiments, the first sidewall 24s1 may be steep or be inclined at the third angle θ3 of about 90 degrees, and the second sidewall 24s2 may be gently inclined at the fourth angle θ4 that is smaller than the third angle θ3. For example, as shown in FIG. 7B, at a position spaced far apart from neighboring active patterns ACT1, ACT3, and ACT4, the bottom surface of the mask pattern 24a may have the fourth width W4. In contrast, as shown in FIG. 7C, at another position adjacent the neighboring active patterns ACT1, ACT3, and ACT4, the bottom surface of the mask pattern 24a may have a fifth width W5 that is smaller than the fourth width W4. As an etching process time increases, a width of the pattern at a position spaced far apart from neighboring active patterns ACT1, ACT3, and ACT4, for example, as illustrated in FIGS. 6B and 7B, may increase.

Figure 8A:
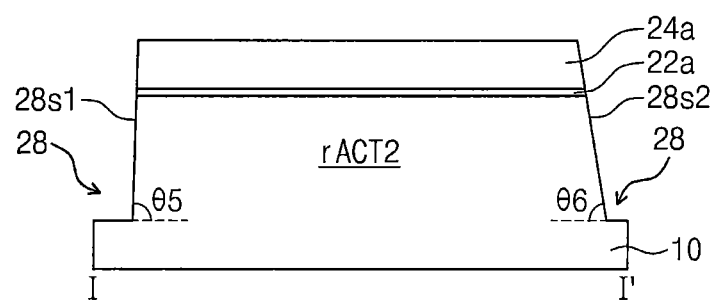
Figure 8B:
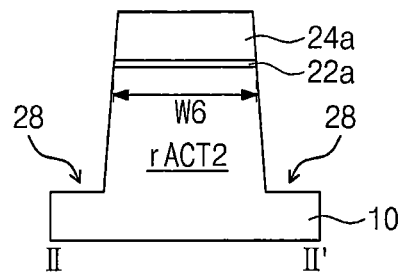
Figure 8C:
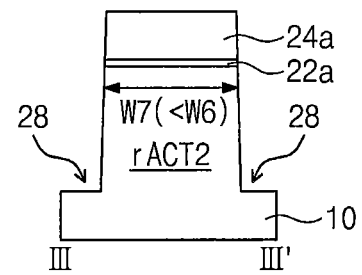
Figure 9A:
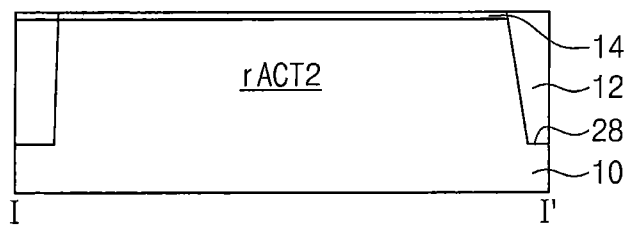
Figure 9B:
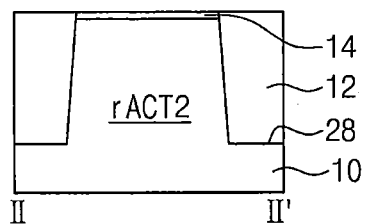
Figure 9C:
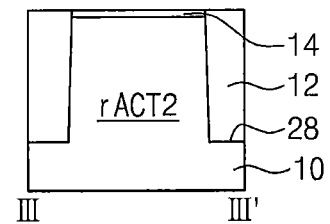

Referring to FIGS. 5 and 8A through 8C, the buffer layer 22 and the substrate 10 may be etched using the mask pattern 24a as an etch mask to form a buffer pattern 22a and a trench 28. The photoresist pattern 26 may be removed during or before the formation of the trench 28. As the result of the formation of the trench 28, a resulting second active region rACT2 may be formed. Although their sectional views are not illustrated, other resulting active regions rACT1, rACT3, and rACT4 may be simultaneously formed concurrently with the resulting second active region rACT2 by the etching process. As discussed above with reference to FIGS. 7A through 7C, in the etching process, there may be a difference in etching environment or condition between the wide and narrow spacing regions, and such a difference may lead to a spatial variation of the sidewall angle of the trench 28. The trench 28 may include a first trench sidewall 28s1 adjacent resulting fourth active region rACT4 and a second trench sidewall 28s2 opposite the first trench sidewall 28s1. The first and second trench sidewalls 28s1 and 28s2 may be inclined at fifth and sixth angles θ5 and θ6 with respect to a top surface of the substrate 10. The first trench sidewall 28s1 may be steep or be inclined at the fifth angle θ5 of about 90 degrees, and the second trench sidewall 28s2 may be gently inclined at the sixth angle θ6 that is smaller than the fifth angle θ5. As shown in FIG. 8B, at the position spaced far apart from neighboring resulting active regions rACT1, rACT3, and rACT4, the resulting second active region rACT2 may have a sixth width W6, and as shown in FIG. 8C, at the another position adjacent the neighboring resulting active regions rACT1, rACT3, and rACT4, the resulting second active region rACT2 may have a seventh width W7 that is smaller than the sixth width W6.

Referring to FIGS. 5 and 9A through 9C, a device isolation layer 12 may be formed to fill the trench 28. The mask pattern 24a and the buffer pattern 22a may be removed to expose the surface of the substrate 10. A gate insulating layer 14 may be formed on the exposed surface of the substrate 10. Although not illustrated, the device isolation layer 12 may also be formed around the resulting active regions rACT1, rACT3, and rACT4.

Referring to FIGS. 5, 10A through 10C, 13A, and 13B, a conductive layer and a capping layer 16 may be sequentially formed on the substrate 10. A second photoresist layer may be coated on the capping layer 16. An exposure process may be performed on the second photoresist layer using one of a third photomask 120a and a fourth photomask 120b, which are prepared based on the gate layouts GT1, tGT2, GT3, and GT4 of FIG. 5.

For example, if the second photoresist layer is of a negative type, the exposure process may be performed using the third photomask 120a of FIG. 13A. The third photomask 120a may include a third transparent substrate 103a and a third light-blocking pattern 104 disposed on the third transparent substrate 103a. The third light-blocking pattern 104 may be formed to include gate openings 105a through 105d having shapes similar to shapes of the gate layouts GT1, tGT2, GT3, and GT4, respectively. At least one of the gate openings (for example, the second gate opening 105b) may be disposed at the outermost region and may have a portion protruding from the others (for example, the first and third gate openings 105a and 105c) in the first direction X. Further, a shape of the second gate opening 105b may be different from those of the other gate openings 105a, 105c, and 105d. The second gate opening 105b may include an eleventh side S11 adjacent the other gate openings 105a, 105c, and 105d and a twelfth side S12 opposite the eleventh side S11. The twelfth side S12 may be longer than the eleventh side S11.

For example, if the second photoresist layer is of a positive type, the exposure process may be performed using the fourth photomask 120b of FIG. 13B. The fourth photomask 120b may include a fourth transparent substrate 103b and gate light-blocking patterns 104a through 104d disposed on the fourth transparent substrate 103b. The gate light-blocking patterns 104a through 104d may include a first gate light-blocking pattern 104a, a second gate light-blocking pattern 104b, a third gate light-blocking pattern 104c and a fourth gate light-blocking pattern 104d. The gate light-blocking patterns 104a through 104d may be formed to have shapes similar to those of the gate layouts GT1, tGT2, GT3, and GT4. At least one of the gate light-blocking patterns (for example, the second gate light-blocking pattern 104b) may be disposed at the outermost region and may have a portion protruding from the others (for example, the first and third gate light-blocking patterns 104a and 104c) in the first direction X. Further, a shape of the second gate light-blocking pattern 104b may be different from those of the other gate light-blocking patterns 104a, 104c, and 104d. The second gate light-blocking pattern 104b may include a thirteenth side S13 adjacent the other gate light-blocking patterns 104a, 104c, and 104d and a fourteenth side S14 opposite the thirteenth side S13. The fourteenth side S14 may be longer than the thirteenth side S13.

Figure 10A:
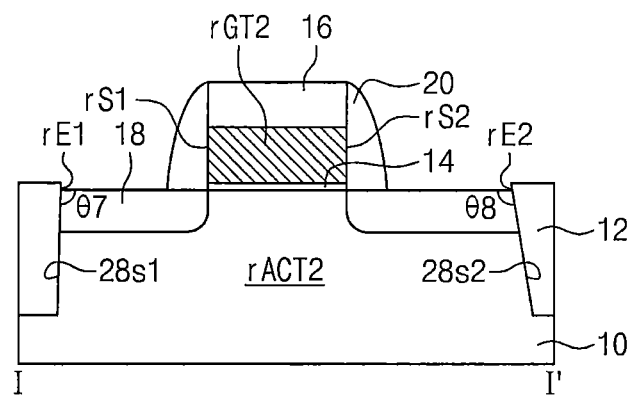
Figure 10B:
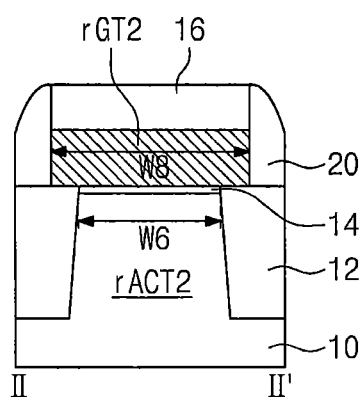
Figure 10C:
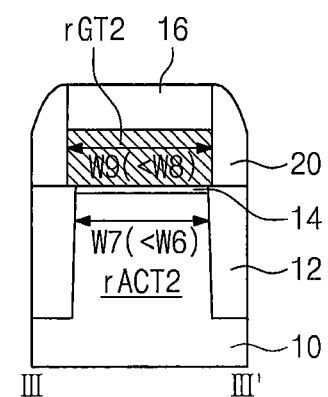

Thereafter, a photoresist pattern defining gate electrodes may be formed and be used to perform a patterning process on the capping layer 16, the conductive layer, and the gate insulating layer 14. Accordingly, the resulting gate electrodes rGT1 through rGT4 may be formed. Due to the assistant patterns P1 and P2, the resulting second gate electrode rGT2 may be formed to have a different width from other resulting gate electrodes rGT1, rGT3, and rGT4. For example, as shown in FIG. 10B, the resulting second gate electrode rGT2 may be formed to have an eighth width W8 on a portion of the resulting second active region rACT2, which is spaced far apart from neighboring resulting active regions rACT1, rACT3, and rACT4 and has the sixth width W6. In contrast, as shown in FIG. 10C, the resulting second gate electrode rGT2 may be formed to have a ninth width W9, on another portion of the resulting second active region rACT2, which is adjacent the neighboring resulting active regions rACT1, rACT3, and rACT4 and has the seventh width W7. In example embodiments, the eighth width 8 may be greater than the ninth width W9. In other words, the resulting second gate electrode rGT2 may have an increased width, and an increase in width of the resulting second gate electrode rGT2 may be proportional to an increase in width of the resulting second active region rACT2. Accordingly, the resulting second gate electrode rGT2 may be formed across or overlapped with the resulting second active region rACT2 with improved process reliability, and this may reduce a leakage current.

After the formation of the resulting gate electrodes rGT1 through rGT4, source/drain regions 18 may be formed in portions of the substrate 10 at both sides of each of the resulting gate electrodes rGT1 through rGT4, and spacers 20 may be formed to cover side surfaces of the resulting gate electrodes rGT1 through rGT4.

Figure 11:
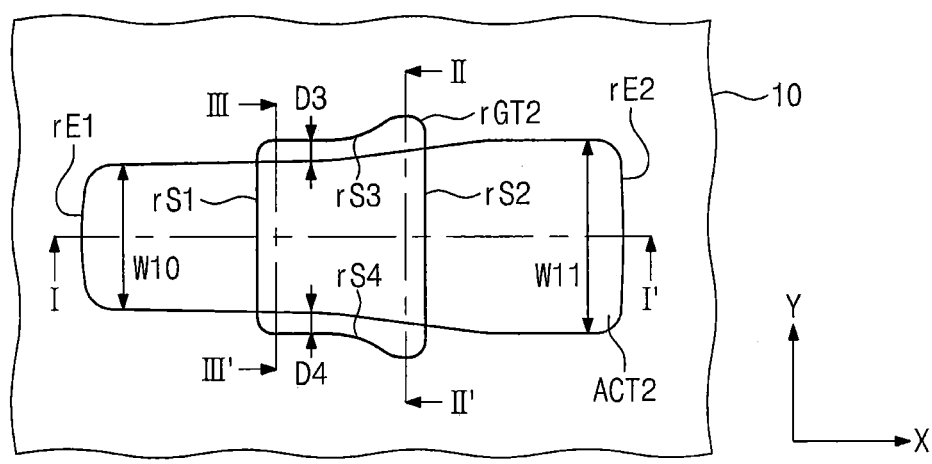
FIG. 11 shows outlines of the resulting second active region rACT2 and the resulting second gate electrode rGT2 of FIG. 5.

FIG. 11 shows outlines of the resulting second active region rACT2 and the resulting second gate electrode rGT2 of FIG. 5.

Referring to FIGS. 5, 10A through 10C, and 11, the device isolation layer 12 may be provided in the substrate 10 to define the resulting second active region rACT2. When viewed from plan perspective, the resulting second active region rACT2 may be shaped like a bar extending in the first direction X. The resulting second active region rACT2 may include resulting first and second ends rE1 and rE2 facing each other. Further, other resulting active regions rACT1, rACT3, and rACT4 may be disposed near to the resulting first end rE1. The resulting second end rE2 may include a portion protruding from the outermost edges of the other resulting active regions rACT1, rACT3, and rACT4 toward the first direction X. The resulting first end rE1 may have a tenth width W10 in a second direction Y crossing the first direction X. The resulting second end rE2 may have an eleventh width W11 in the second direction Y. The eleventh width W11 may be larger than the tenth width W10. A sidewall of the device isolation layer 12 adjacent the resulting first end rE1 may be inclined at the seventh angle θ7 with respect to the top surface of the substrate 10, and another sidewall of the device isolation layer 12 adjacent the resulting second end rE2 may be inclined at the eighth angle θ8 with respect to the top surface of the substrate 10. The eighth angle θ8 is different from the seventh angle θ7. The eighth angle θ8 may be greater than the seventh angle θ7.

Thereafter, the resulting second gate electrode rGT2 may be provided to cross a central region of the second active region rACT2. The resulting second gate electrode rGT2 may include the resulting first side rS1 adjacent the resulting first end rE1 and the resulting second side rS2 opposite the resulting first side rS1. The resulting second and first sides rS2 and rS1 may have the eighth and ninth widths W8 and W9 in the second direction Y, respectively. The eighth width W8 may be greater than the ninth width W9. The resulting second gate electrode rGT2 may further include the resulting third side rS3, which is positioned adjacent the resulting first active region rACT1 and between the resulting first side rS1 and the resulting second side rS2, and the resulting fourth side rS4, which is positioned adjacent the resulting third active region rACT3 and between the resulting first side rS1 and the resulting second side rS2. The resulting third side rS3 may be bent toward the resulting first active region rACT1, and the resulting fourth side rS4 may be bent toward the resulting third active region rACT3. Widths D3 and D4 of the resulting first and second sides rS1 and rS2, which are overlapped with the device isolation layer 12, may be about 30 nm or greater than 30 nm. Alternatively, a distance D3 between the resulting third side rS3 and a sidewall of the resulting second active region rACT2 and a distance D4 between the resulting fourth side rS4 and a sidewall of the resulting second active region rACT2 be about 30 nm or greater. The distances D3 and D4 may not vary according to a position. Accordingly, the resulting second gate electrode rGT2 can be formed across or overlapped with the resulting second active region rACT2 with improved process reliability, and this may reduce a leakage current.

Figure 14:
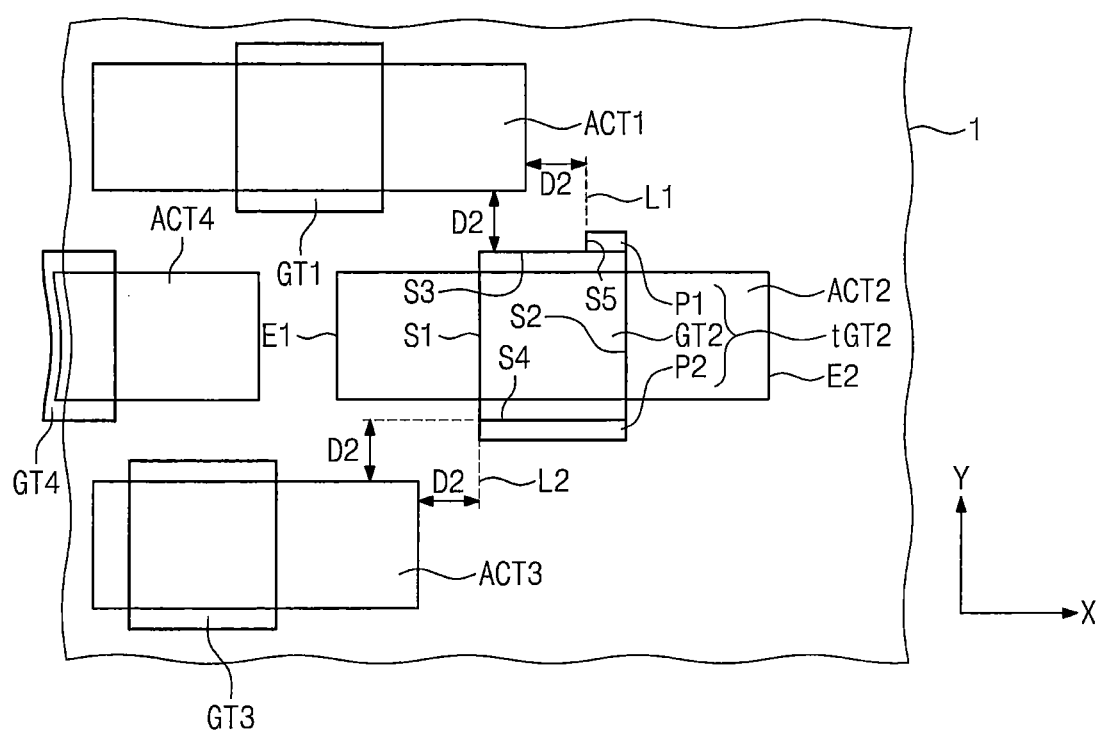
FIG. 14 shows a layout of a semiconductor device according to some example embodiments of the inventive concept.

FIG. 14 shows a layout of a semiconductor device according to some example embodiments of the inventive concept.

Referring to FIG. 14, the third active pattern ACT3 may be formed to be offset in an opposite direction of the first direction X, compared with that of FIG. 4. The second assistant pattern P2 may be provided to cover the entire fourth side S4 of the second main gate pattern GT2. The second assistant pattern P2 may have a length substantially equal to a length of the fourth side S4 of the second main gate pattern GT2 in the first direction C. Except for this difference, the layout in the present embodiments may be configured to have the same or similar features as that of the previous embodiments described with reference to FIGS. 1 through 4.

Figure 15:
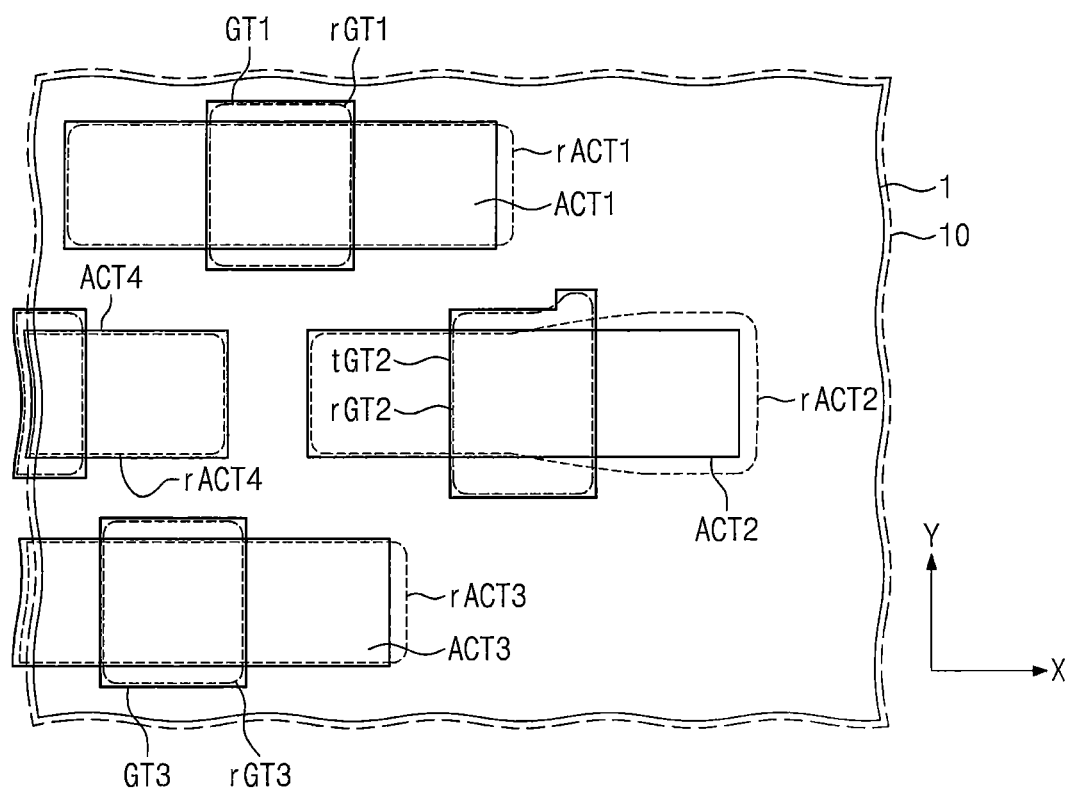
FIG. 15 is a plan view illustrating a planar shape of a resulting pattern that is overlapped on the layout of FIG. 14.

FIG. 15 is a plan view illustrating a resulting pattern that is overlapped on the layout of FIG. 14.

Referring to FIG. 15, in the case that the layout of FIG. 14 is used to fabricate a semiconductor device, a resulting second gate electrode rGT2 may have asymmetric shape. Except for this difference, a fabricating process and a semiconductor device formed using the fabricating process in the this embodiment may be configured to have the same or similar features as that of the previous embodiments described with reference to FIGS. 5 through 11.

In some example embodiments, the methods of preparing a layout and fabricating a semiconductor device using the layout may be applied to both the peripheral circuit and a cell array region.

Figure 16:
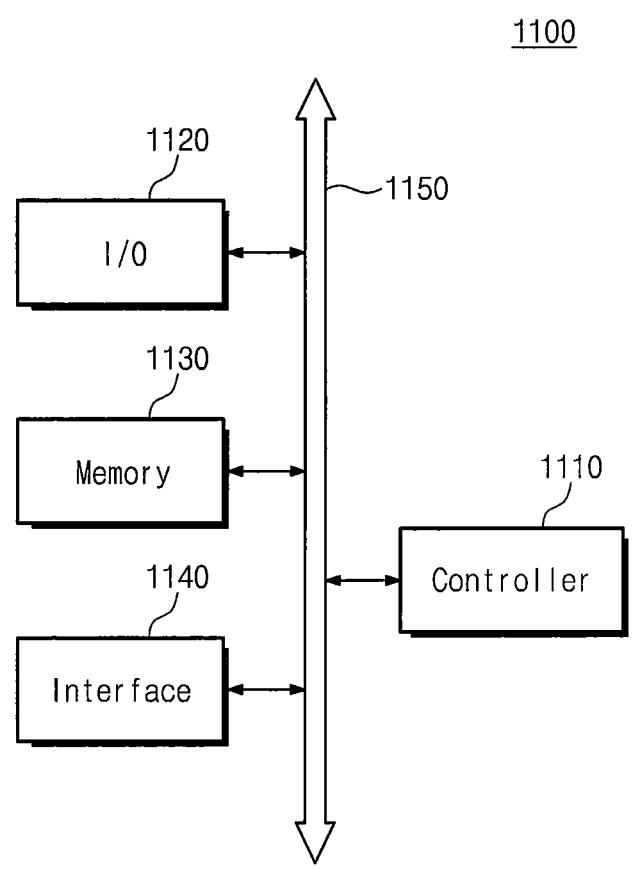
FIG. 16 is a schematic block diagram illustrating an example of electronic systems including a semiconductor device according to example embodiments of the inventive concept.

FIG. 16 is a schematic block diagram illustrating an example of electronic systems including a semiconductor device according to example embodiments of the inventive concept.

Referring to FIG. 16, an electronic system 1100 may be applied to a PDA (personal digital assistant), a portable computer, a web tablet, a wireless phone, a mobile phone, a digital music player, a memory card and/or all the devices that can transmit and/or receive data in a wireless communication environment.

The electronic system 1100 may include a controller 1110, an input/output (I/O) device 1120 (e.g., a keypad and/or a display device), a memory 1130, an interface 1140 and a bus 1150. The memory 1130 and the interface 1140 may communicate with each other through the bus 1150.

The controller 1110 may include a microprocessor, a digital signal processor, a micro controller and/or other process devices similar to the microprocessor, the digital signal processor and the micro controller. The memory 1130 may be used to store an instruction executed by the controller 1110. The input/output device 1120 may receive data and/or a signal from the outside of the electronic system 1100 and/or transmit data and/or a signal to the outside of the electronic system 1100. For example, the input/output device 1120 may include a keyboard, a keypad and/or a displayer.

The memory 1130 may include the semiconductor device according to example embodiments of the inventive concept. The memory 1130 may further include a different kind of memory, a volatile memory device capable of random access and various kinds of memories.

The interface 1140 may transmit data to a communication network and/or may receive data from a communication network.

According to example embodiments of the inventive concept, a layout for a semiconductor device may be prepared in such a way that assistant patterns are disposed near a main gate pattern on a weak one of active patterns. The weak active pattern may be, for example, an outermost one of the active patterns and may be one expected to have an increased width during an actual fabrication process. The presence of the assistant patterns may reduce or possibly prevent the occurrence of a leakage current and thus may improve uniformity of electric characteristics of transistors. Accordingly, the semiconductor device may have improved reliability.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
   a substrate;
   a device isolation layer provided in the substrate to define a first active region, a second active region and a third active region, the first, second and third active regions extending in a first direction and being sequentially arranged in a second direction that is different from the first direction, each of the first, second and third active regions comprising opposing first and second ends, the second ends of the first, second and third active regions facing the first direction, and the second end of the second active region protruding beyond the second ends of the first and third active regions toward the first direction; and
   a gate electrode crossing the second active region, wherein:
   the second active region consists of a first portion protruding beyond the second end of the first active region toward the first direction and a second portion;
   the gate electrode consists of a third portion protruding beyond the second end of the first active region toward the first direction and a fourth portion;
   a width of the first portion in the second direction gradually increases along the first direction;
   a width of the third portion in the second direction gradually increases along the first direction;
   the gate electrode comprises opposing first and second sidewalls, and the second sidewall faces the first direction
   the first sidewall of the gate electrode has a length in the second direction that is less than that of the second sidewall of the gate electrode; and
   the first end of the second active region has a length in the second direction that is less than that of the second end of the second active region.

2. The device of claim 1, wherein a length of each of the first and second sidewalls overlapped with the device isolation layer is at least 30 nm.

3. The device of claim 1, wherein:
   a sidewall of the device isolation layer adjacent the first end of the second active region forms a first angle with respect to a top surface of the substrate;
   another sidewall of the device isolation layer adjacent the second end of the second active region forms a second angle with respect to the top surface of the substrate; and
   the first angle and the second angle are different.

4. The device of claim 3, wherein the first angle is smaller than the second angle.

5. The device of claim 1, wherein the gate electrode has an asymmetric shape in a plan view.

6. The device of claim 1, wherein an area of the first portion is larger than an area of the second portion.

7. The device of claim 1, wherein a variation in the width of the first portion in the second direction is greater than a variation in a width of the second portion in the second direction.

8. The device of claim 1, wherein the width of the third portion in the second direction and the width of the first portion in the second direction vary while maintaining that the width of the third portion is greater than the width of the first portion.

* * * * *